United States Patent
Hong et al.

(10) Patent No.: US 10,749,485 B2
(45) Date of Patent: Aug. 18, 2020

(54) DIGITAL PREDISTORTION PROCESSING APPARATUS

(71) Applicant: Huawei Technologies Co., Ltd., Shenzhen, Guangdong, P.R. (CN)

(72) Inventors: Yiwei Hong, Shanghai (CN); Xianglin Li, Shanghai (CN); Yuxiang Xiao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/241,674

(22) Filed: Jan. 7, 2019

(65) Prior Publication Data

US 2019/0140605 A1 May 9, 2019

Related U.S. Application Data

(63) Continuation of application No. PCT/CN2016/089444, filed on Jul. 8, 2016.

(51) Int. Cl.
*H04K 1/02* (2006.01)
*H04L 25/49* (2006.01)
(Continued)

(52) U.S. Cl.
CPC .......... *H03F 3/213* (2013.01); *H03F 1/3247* (2013.01); *H03F 1/3252* (2013.01); *H03F 3/195* (2013.01);
(Continued)

(58) Field of Classification Search
CPC ........ H03F 3/213; H03F 3/195; H03F 1/3247; H03F 1/3252; H03F 2200/451; H04L 25/49
(Continued)

(56) References Cited

U.S. PATENT DOCUMENTS

| | | | |
|---|---|---|---|
| 8,218,678 B2* | 7/2012 | Kim | H03F 1/3247 375/297 |
| 8,391,809 B1* | 3/2013 | Fuller | H04B 1/0475 455/114.3 |

(Continued)

FOREIGN PATENT DOCUMENTS

| | | |
|---|---|---|
| CN | 101316124 A | 12/2008 |
| CN | 101594327 A | 12/2009 |

(Continued)

OTHER PUBLICATIONS

Ma, Yuelin et al., "Spectra-Folding Feedback Architecture for Concurrent Dual-Band Power Amplifier Predistortion", IEEE Transactions on Microwave Theory and Techniques, Plenum, USA, vol. 63, No. 10, Oct. 2015, pp. 3164-3174,XP011670665.

(Continued)

*Primary Examiner* — Tanmay K Shah
(74) *Attorney, Agent, or Firm* — Slater Matsil, LLP

(57) ABSTRACT

Embodiments of the present disclosure provide a digital predistortion processing apparatus, where the apparatus includes an analog-to-digital conversion unit and n digital predistortion elements. The analog-to-digital conversion unit is connected to the n digital predistortion elements. Each digital predistortion element is configured to receive n input signals, perform digital predistortion processing on the n input signals, and then output n processed signals. The analog-to-digital conversion unit is configured to receive the n processed signals, perform signal extraction based on the n processed signals, and output an extracted signal, where a rate of the extracted signal is the same as a rate of each of the n processed signals. For an ultra-large-bandwidth signal, DPD correction may be performed without increasing a technical level of existing components such as an FPGA and an ADC, thereby greatly reducing implementation costs.

8 Claims, 3 Drawing Sheets

(51) Int. Cl.
*H03F 3/213* (2006.01)
*H03F 1/32* (2006.01)
*H03F 3/195* (2006.01)

(52) U.S. Cl.
CPC ........ *H04L 25/49* (2013.01); *H03F 2200/451* (2013.01)

(58) Field of Classification Search
USPC .......................................................... 375/297
See application file for complete search history.

(56) References Cited

U.S. PATENT DOCUMENTS

| | | | |
|---|---|---|---|
| 8,817,859 B2 | 8/2014 | Ghannouchi et al. | |
| 2003/0179831 A1* | 9/2003 | Gupta | H03F 1/3247 375/296 |
| 2007/0241812 A1 | 10/2007 | Yang et al. | |
| 2008/0144539 A1* | 6/2008 | Sperlich | H04L 5/1469 370/278 |
| 2012/0155572 A1* | 6/2012 | Kim | H03F 1/3247 375/297 |
| 2013/0094610 A1* | 4/2013 | Ghannouchi | H03F 1/3247 375/296 |
| 2014/0016725 A1 | 1/2014 | Peroulas et al. | |
| 2014/0362946 A1* | 12/2014 | Kakishima | H04B 7/0456 375/295 |

FOREIGN PATENT DOCUMENTS

| | | |
|---|---|---|
| CN | 102088427 A | 6/2011 |
| CN | 103493367 A | 1/2014 |
| CN | 104393844 A | 3/2015 |

OTHER PUBLICATIONS

Hammi, Oualid et al., "Digital Subband Filtering Predistorter Architecture for Wireless Transmitters", IEEE Transactions on Microwave Theory and Techniques, Plenum, USA, vol. 53, No. 5, May 2005, pp. 1643-1652, XP011131605.

Murmann, Boris et al., "Digitally enhanced analog circuits: System aspects", ISCAS 2008, IEEE International Symposium on Circuits and Systems, Piscataway, NJ, USA, May 18, 2008, pp. 560-563, XP031392034.

Pham, Dang-Kien Germain et al., "A Subsampled Adaptive Subband Digital Predistortion Algorithm", 2014 IEEE 12th International New Circuits and Systems Conference (NEWCAS), IEEE, Jun. 22, 2014, pp. 25-28, XP032668051.

* cited by examiner

DIGITAL PREDISTORTION PROCESSING APPARATUS

CROSS-REFERENCE TO RELATED APPLICATIONS

This application is a continuation of International Application No. PCT/CN2016/089444 filed on Jul. 8, 2016, the disclosure of which is hereby incorporated by reference in its entirety.

TECHNICAL FIELD

The present application relates to communications technologies, and in particular, to a digital predistortion processing apparatus.

BACKGROUND

A digital predistorter (DPD) is a current mainstream apparatus for power amplifier predistortion correction, and has been widely used in previous second-generation, third-generation, and fourth-generation communications technologies.

With continuous development of communications technologies, available bandwidths also keep increasing. To adapt to a larger bandwidth, a 2-fold bandwidth sampling manner is used for solving in the prior art. Specifically, a feedback signal with a bandwidth of four to five times larger than a signal bandwidth is sampled by using a high-speed analog-to-digital converter (ADC) and transmitted to a field programmable gate array (FPGA)/an application-specific integrated circuit (ASIC) by using a serializer/deserializer (SerDes). The FPGA/ASIC performs low-pass filtering to remove a specific stray signal, then performs 2-fold bandwidth signal extraction, and feeds back an extracted signal for preprocessing. After being phase-aligned, the signal is sent to a solving unit for solving, so as to meet a larger-bandwidth requirement.

However, in research of the communications technologies, a DPD feedback bandwidth of a future mobile communications technology, such as the fifth-generation mobile communications technology (5G), may reach 3 to 4 gigahertz (GHz). However, energy consumption of a prior-art ADC still cannot satisfy such an ultra-large bandwidth.

SUMMARY

Embodiments of the present disclosure provide a digital predistortion processing apparatus, so as to resolve a problem that energy consumption of an ADC cannot meet an ultra-large bandwidth requirement in a digital predistortion processing process in the prior art.

A first aspect of the embodiments of the present disclosure provides a digital predistortion processing apparatus, including an analog-to-digital conversion unit and n digital predistortion elements, where the analog-to-digital conversion unit is connected to the n digital predistortion elements, and n is a positive integer greater than 1;

each digital predistortion element is configured to receive n input signals, perform digital predistortion processing on the n input signals, and then output n processed signals; and the analog-to-digital conversion unit is configured to receive the n processed signals, perform signal extraction based on the n processed signals, and output an extracted signal, where a rate of the extracted signal is the same as a rate of each of the n processed signals.

Optionally, the apparatus further includes a delay solver, where an input end of the delay solver is connected to an output end of the analog-to-digital conversion unit, and an output end of the delay solver is separately connected to input ends of the n digital predistortion elements.

The delay solver is configured to receive the extracted signal output by the analog-to-digital conversion unit, perform solving based on the extracted signal to obtain a feedback signal, and send the feedback signal to the n digital predistortion elements.

Optionally, the n digital predistortion elements are specifically configured to perform digital predistortion processing on the n input signals based on the feedback signal.

Optionally, the feedback signal is a low-speed integer delay signal.

Optionally, the apparatus further includes n equalization elements, and an input end of each equalization element is separately connected to output ends of the n digital predistortion elements.

Each equalization element is configured to receive the n processed signals output by the n digital predistortion elements, perform equalization compensation processing on the n processed signals, and output n signals obtained through equalization compensation.

Optionally, the apparatus further includes n mirroring cancellation elements, and an input end of each mirroring cancellation element is separately connected to output ends of the n equalization elements.

Each mirroring cancellation element is configured to receive the n signals that are obtained through equalization compensation and that are output by the n equalization elements, perform mirroring cancellation processing on the n signals obtained through equalization compensation, and output n signals obtained through mirroring cancellation.

Optionally, the apparatus further includes n crest factor reduction elements, and all output ends of the n crest factor reduction elements are connected to the input end of each digital predistortion element.

Each crest factor reduction element is configured to receive one original input signal, perform crest factor reduction processing on the original input signal to obtain the input signal, and send the input signal to the n digital predistortion elements.

Further, the analog-to-digital conversion unit includes:

an ADC, configured to receive the n processed signals, perform analog-to-digital conversion, and output a converted-to digital signal.

Further, the analog-to-digital conversion unit further includes a deep undersampling element, and the deep undersampling element is connected to the ADC.

The deep undersampling element is configured to perform signal extraction based on the converted-to digital signal, and output the extracted signal.

Optionally, each digital predistortion element is further configured to perform delay processing on the n input signals before performing digital predistortion processing on the n input signals.

The digital predistortion processing apparatus provided in the embodiments of the present disclosure receives the n input signals, performs digital predistortion processing on the n input signals, and then outputs the n processed signals. Then, the analog-to-digital conversion unit performs signal extraction based on the n processed signals, and outputs the extracted signal, where the rate of the extracted signal is the same as the rate of each of the n processed signals. This ensures that a lower-rate signal is output from the output end of the analog-to-digital conversion unit, so as to meet an energy consumption requirement of the analog-to-digital conversion unit and an output rate of an existing license standard; for an ultra-large-bandwidth signal, DPD correction may be performed without increasing a technical level of existing components such as an FPGA and an ADC, thereby greatly reducing implementation costs.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show some embodiments of the present disclosure, and persons of ordinary skill in the art may derive other drawings from these accompanying drawings without creative efforts.

DETAILED DESCRIPTION

With development of communications technologies, an ultra-large bandwidth is a development trend. For example, an ultra-large bandwidth of 3 GHz to 4 GHz may be used in the future 5G field. Correspondingly, a transmission rate for the ultra-large bandwidth is also quite high. The embodiments of the present disclosure are intended to perform DPD correction and also meet an output rate required by an existing ADC license, without increasing a technical level of existing components such as an FPGA and an ADC.

Figure 1:
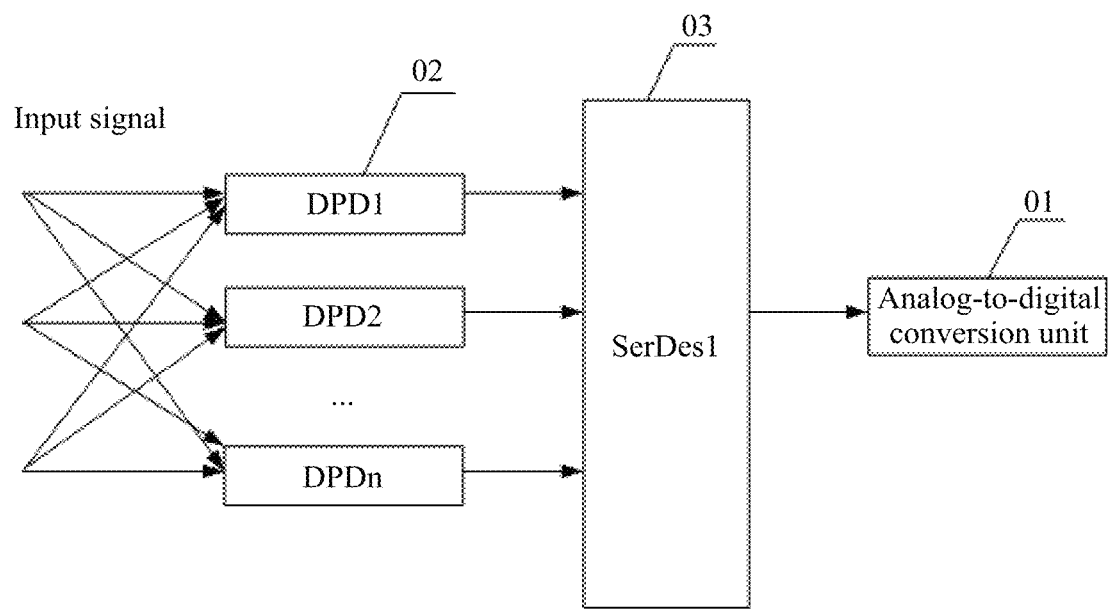
FIG. 1 is a schematic structural diagram of Embodiment 1 of a digital predistortion processing apparatus according to the present disclosure.
Figure 2:
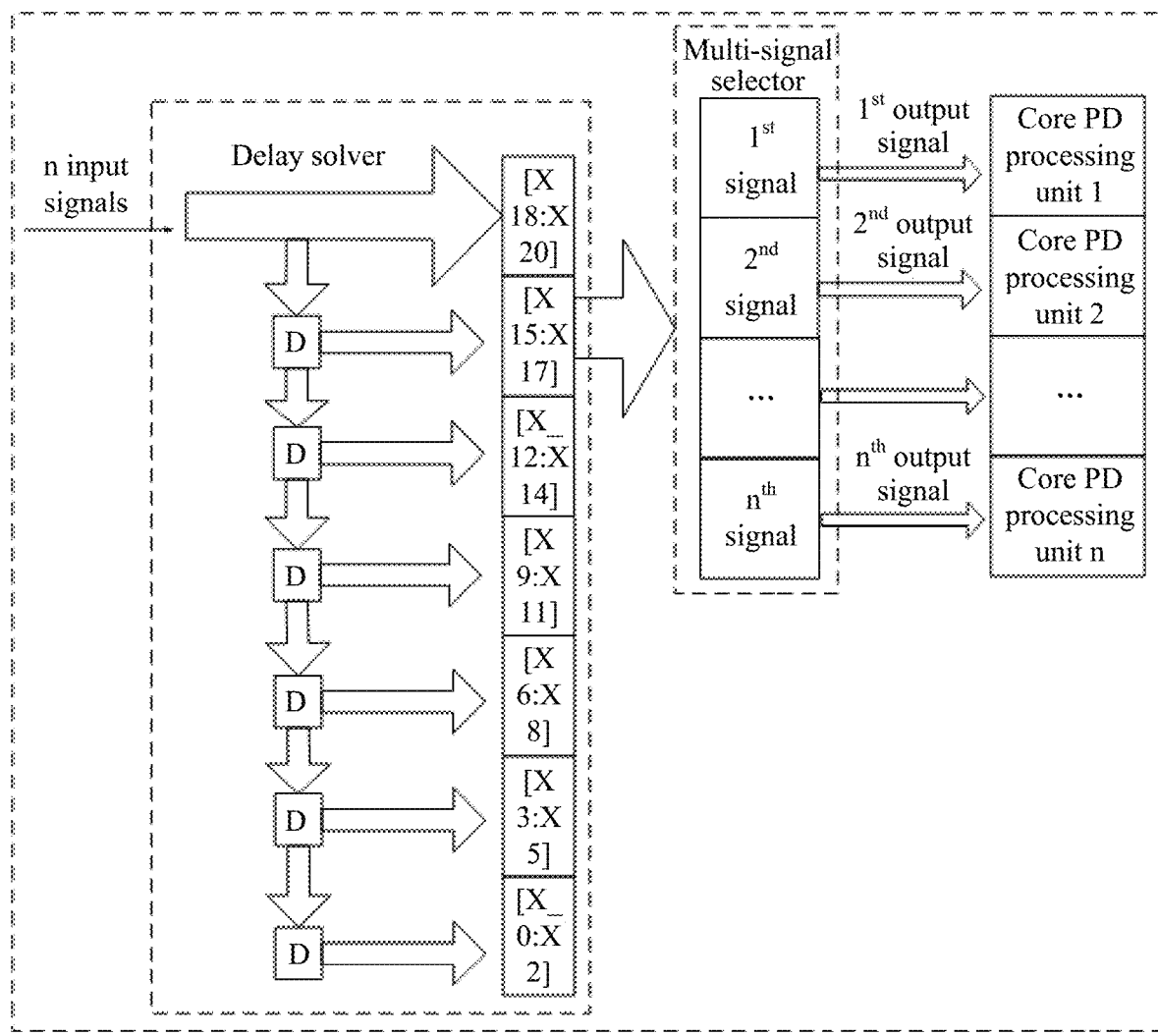
FIG. 2 is a schematic diagram of an internal structure of a digital predistortion element in FIG. 1.

FIG. 1 is a schematic structural diagram of Embodiment 1 of a digital predistortion processing apparatus according to the present disclosure, and FIG. 2 is a schematic diagram of an internal structure of a digital predistortion element in FIG. 1.

As shown in FIG. 1, the apparatus includes an analog-to-digital conversion unit 01 and n digital predistortion elements 02.

Referring to FIG. 1, the analog-to-digital conversion unit 01 is connected to the n digital predistortion elements 02, where n is a positive integer greater than 1. During specific implementation, n may be designed depending on a product requirement. This is not limited herein.

In a specific implementation process, a serializer/deserializer (SerDes) 03 may be deployed at output ends of the n digital predistortion elements 02, and the n digital predistortion elements 02 are connected to the analog-to-digital conversion unit 01 by using the SerDes 03. This is not limited herein.

Each digital predistortion element 02 is configured to receive n input signals, perform digital predistortion processing on the n input signals, and then output n processed signals.

Specifically, digital predistortion processing performed by the digital predistortion element 02 may specifically include non-linear predistortion, memory predistortion, and the like. This is not limited herein.

In the prior art, a DPD processes only one signal that the DPD is responsible for, and also outputs only one signal. A difference between this embodiment and the prior art lies in that the DPD considers not only the signal of the DPD but also all other signals. In other words, each DPD processes the n input signals, and outputs n processed signals after processing. Optionally, as shown in FIG. 2, a multi-signal selector in the digital predistortion element 02 performs selection on each input signal depending on a processing requirement and then outputs the n processed signals.

The analog-to-digital conversion unit 01 is configured to receive the n processed signals, perform signal extraction based on the n processed signals, and output an extracted signal. A rate of the extracted signal is the same as a rate of each of the n processed signals.

Specifically, before the analog-to-digital conversion unit 01 performs analog-to-digital conversion, each of the n DPDs processes the n input signals, and then outputs output signals to the analog-to-digital conversion unit 01. After performing analog-to-digital conversion on an input signal, the analog-to-digital conversion unit 01 performs sampling. In an extraction process, the rate of the extracted signal is the same as the rate of each of the n processed signals. In this case, the rate of the extracted signal is much lower than a rate of the entire signals; if an ultra-large-bandwidth signal is input and processed as the foregoing, a rate of a signal output by the analog-to-digital conversion unit 01 is also relatively low.

The digital predistortion processing apparatus provided in this embodiment receives the n input signals, performs digital predistortion processing on the n input signals, and outputs the n processed signals. Then, the analog-to-digital conversion unit performs signal extraction based on the n processed signals, and outputs the extracted signal, where the rate of the extracted signal is the same as the rate of each of the n processed signals. This ensures that a lower-rate signal is output from the output end of the analog-to-digital conversion unit, so as to meet an energy consumption requirement of the analog-to-digital conversion unit and an output rate of an existing license standard; for an ultra-large-bandwidth signal, DPD correction may be performed without increasing a technical level of existing components such as an FPGA and an ADC, thereby greatly reducing implementation costs.

Optionally, before performing digital predistortion processing on the n signals, each digital predistortion element 02 may further perform delay processing on the n input signals.

Referring to FIG. 2, the DPD includes a delay processor, a multi-signal selector, and n core predistortion (PD) processing units. In FIG. 2, n=3 is used as an example. After the n signals are input into the DPD, the delay processor first performs delay processing. The delay processor includes a plurality of storage units (for example, [X_18:X_20], . . . , [X_0:X_2]). Each storage unit is capable of storing three signals, and stores the three parallel signals in different storage units and then transmits time-delayed signals to the multi-signal selector for selection. The multi-signal selector selects a signal depending on a requirement of each core PD processing unit, and outputs a selected output signal to a corresponding core PD processing unit for predistortion processing.

Specifically, a delay may be determined depending on an actual requirement, and is not limited herein.

Figure 3:
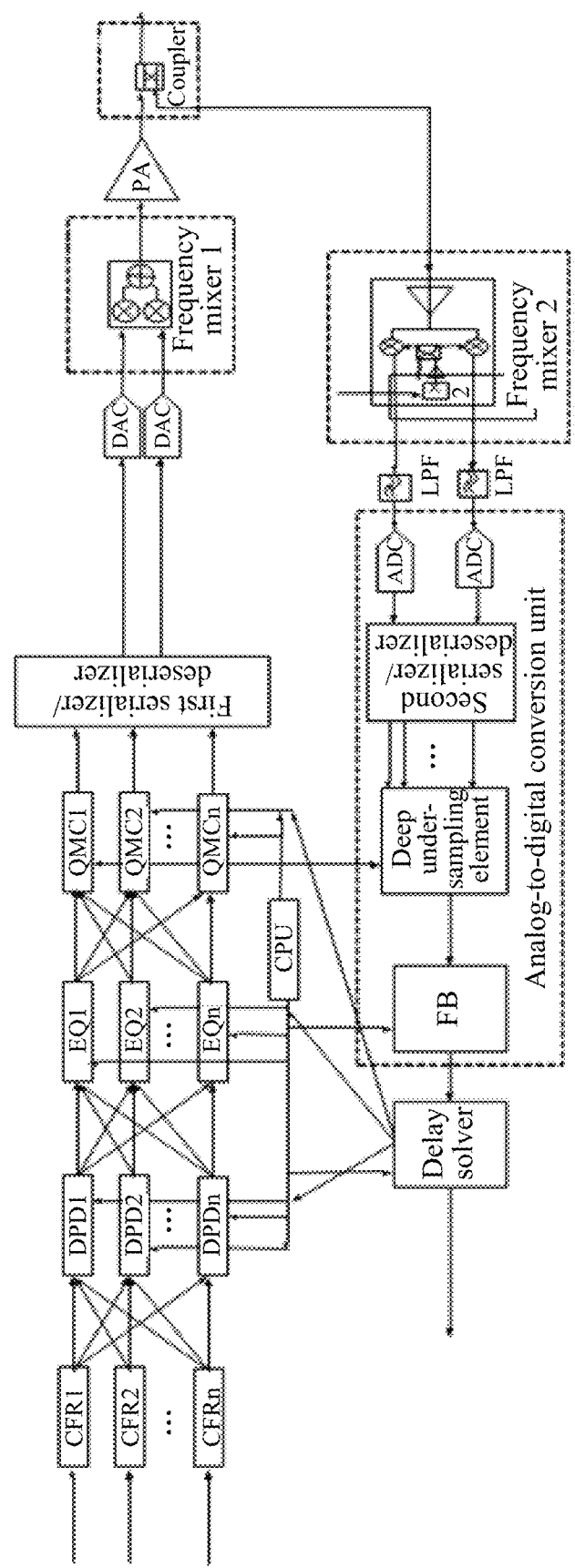
FIG. 3 is a schematic structural diagram of Embodiment 2 of a digital predistortion processing apparatus according to the present disclosure.

FIG. 3 is a schematic structural diagram of Embodiment 2 of a digital predistortion processing apparatus according to the present disclosure. FIG. 3 is an example of a relatively complete digital predistortion processing apparatus. However, an actual structure is not limited thereto. The following specifically describes constituent elements. Some of the elements are optional elements and may be deployed depending on a specific requirement.

As shown in FIG. 3, on a basis of FIG. 1, the apparatus may further include n equalization elements (EQ). An input end of each EQ is separately connected to the output ends of the n DPDs.

Optionally, each EQ receives the n processed signals output by the n DPDs, performs equalization compensation processing on the n processed signals, and outputs n signals obtained through equalization compensation.

Similar to the DPD, each EQ in this embodiment also processes all of the n signals and outputs the n processed signals. An internal structure of the EQ may be the same as an internal structure of the DPD shown in FIG. 2, and a difference lies in that the core PD processing unit may be replaced with a corresponding equalization compensation unit. Details are not described herein.

Further, the apparatus may further include n mirroring cancellation elements, and an input end of each mirroring cancellation element is separately connected to output ends of the n equalization elements.

Specifically, each mirroring cancellation element is configured to receive the n signals that are obtained through equalization compensation and that are output by the n equalization elements, perform mirroring cancellation processing on the received n signals, and output n signals obtained through mirroring cancellation.

Further, the n signals obtained through mirroring cancellation continue to be transmitted after being converted by a first serializer/deserializer SerDes 1.

Optionally, the apparatus may alternatively include no EQ, and the input end of each mirroring cancellation element is directly connected to the output ends of the n DPDs. In other words, the n processed signals output by the DPDs are directly input into the mirroring cancellation elements.

Optionally, the mirroring cancellation element may be a qutratual mirroring cancellation element (QMC). Referring to FIG. 3 and using the QMC as an example, an input end of each QMC is connected to the output ends of the n EQs. The QMCs receive the n signals that are obtained through equalization compensation and that are output by the n equalization elements, perform mirroring cancellation processing on the n signals obtained through equalization compensation, and output n signals obtained through mirroring cancellation.

Optionally, as shown in FIG. 3, the apparatus may further include n crest factor reduction elements (CFR). The CFRs may be deployed before the DPDs and are configured to perform crest factor reduction processing on original input signals, specifically, to reduce a peak-to-average ratio of the original input signals to some extent.

An input end of each CFR receives only one original input signal and performs crest factor reduction processing on the one original input signal to obtain the input signal. An output end of each CFR also outputs only one input signal. However, output ends of the n CFRs are connected to each DPD, that is, each DPD receives signals output by the n CFRs.

In the apparatus shown in FIG. 3, the n CFRs, the n DPDs, the n EQs, and the n QMCs constitute a full-crossed digital predistortion processing system inside the apparatus. To be specific, after the n signals are output from the n CFRs, each DPD, EQ, and QMC process the n signals and output n signals, so as to allow a subsequent analog-to-digital conversion unit to extract a lower-rate signal during extraction. Structures of the DPD, EQ, and QMC are similar, and reference may be made to the structure shown in FIG. 2. Specifically, the core PD processing unit in FIG. 2 may be replaced with another corresponding functional processing unit. Details are not described herein.

Further, as shown in FIG. 3, on a basis of FIG. 1, the apparatus may further include a delay solver. An input end of the delay solver is connected to an output end of the analog-to-digital conversion unit, and an output end of the delay solver is separately connected to input ends of the n digital predistortion elements.

The delay solver is configured to receive the extracted signal output by the analog-to-digital conversion unit, perform solving based on the extracted signal to obtain a feedback signal, and send the feedback signal to the n digital predistortion elements.

It should be noted that, after performing solving based on the extracted signal output by the analog-to-digital conversion unit, the delay solver not only directly outputs a part of signals, but also acts as a part of a feedback loop to transmit the feedback signal to the DPD, so that the DPD performs digital predistortion processing on the n input signals based on the feedback signal. This forms a cyclic process.

Optionally, if the apparatus further includes the EQ and/or the QMC, the delay solver also transmits the feedback signal to the EQ and/or the QMC.

Optionally, the delay solver may perform solving to obtain a low-speed integer delay, a high-speed integer delay, a high-speed fractional delay, and the like. The low-speed integer delay may be a delay of each signal, or may be construed as being measured at a rate of each signal. The high-speed integer delay may be an integer part of a total delay of the n signals, and may be construed as being measured at a total rate of the n signals. The high-speed fractional delay may also be a fractional part of the total delay of the n signals, and may be specifically measured in a unit less than the high-speed integer delay. For example, actually, the total delay of the n signals is 3.2, the high-speed integer delay is 3, and the high-speed fractional delay is 0.2.

Optionally, the feedback signal may be a low-speed integer delay.

In addition, the high-speed integer delay and the high-speed fractional delay may be used to compensate a signal in the analog-to-digital conversion unit, and specifically, may compensate a signal in a signal extraction process of the analog-to-digital conversion unit.

Optionally, the feedback signal transmitted to these elements may be a specific coefficient, and these elements performs signal processing by using the coefficient. Certainly, this is not limited.

Using an apparatus structure shown in FIG. 3 as an example, the input signals successively pass through the CFRs, the DPDs, the EQs, the QMCs, so that the n signals are output from the QMCs. The n signals are output to a digital-to-analog converter (DAC) by using the SerDes 1. After performing signal conversion, the DAC transmits a signal to a frequency mixer 1, and then the signal is output to a coupler by using a power amplifier. In the coupler, the signal is output to an antenna and also enters the feedback loop. To be specific, the signal is transmitted to a frequency mixer 2, and after being processed by the frequency mixer 2, is transmitted to a low pass filter (LPF). After being filtered by the LPF, the signal is transmitted to the analog-to-digital conversion unit for analog-to-digital conversion and feedback sampling.

In this embodiment, because a rate of a signal extracted by the analog-to-digital conversion unit during sampling is a rate of one signal in the n signals, a rate of the signal input into the delay solver is much lower than a rate of the entire input signals. This greatly reduces solving complexity and also reduces feedback power consumption of the DPD.

Still further, referring to FIG. 3, the analog-to-digital conversion unit includes an ADC and a deep undersampling element. It should be noted that the deep undersampling element is an element that performs sampling at a multiple less than 1.

The ADC is configured to receive the n processed signals, perform analog-to-digital conversion, and output a converted-to digital signal. The ADC may process an ultra-large-bandwidth signal and transmit a processed signal to the deep undersampling element, so as to ensure a relatively low rate of a subsequent output signal.

The deep undersampling element is configured to perform signal extraction based on the converted-to digital signal, and output an extracted signal. In other words, a rate of the extracted signal is lower than a rate of an original entire signal.

Optionally, the ADC and the deep undersampling element may be connected to each other by using a second serializer/deserializer SerDes2. Specifically, the SerDes2 may convert a signal obtained through analog-to-digital conversion into n signals.

Further, referring to FIG. 3, the analog-to-digital conversion unit may further include a feedback link (FB). The feedback link is connected between the deep undersampling element and the delay solver. Specifically, an output end of the deep undersampling element is connected to an input end of the FB, and an output end of the FB is connected to an input end of the delay solver.

The FB may be specifically configured to perform some preprocessing operations, such as frequency conversion and rate changing, on a signal. This is not limited herein.

It should be noted that these elements in the foregoing circuit may be implemented by using one or more integrated circuits, for example, one or more application-specific integrated circuits (ASIC), one or more microprocessors (DSP), or one or more field programmable gate arrays (FPGA). For example, the DPD may be implemented by using the FPGA. This is not limited herein.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A digital predistortion processing apparatus, comprising:
    n digital predistortion elements, each of the n digital predistortion elements configured to receive n input signals, perform digital predistortion processing on the n input signals, and output n processed signals, wherein n is a positive integer greater than 1;
    an analog-to-digital conversion unit coupled to the n digital predistortion elements and configured to receive the n processed signals from each of the n digital predistortion elements, perform signal extraction based on the n processed signals, and output an extracted signal, wherein a rate of the extracted signal is the same as a rate of each of the n processed signals;
    n equalization elements each having an input end separately connected to output ends of each of the n digital predistortion elements, and wherein each equalization element is configured to receive the n processed signals output by each of the n digital predistortion elements, perform equalization compensation processing on the n processed signals, and output n signals obtained through equalization compensation; and
    n mirroring cancellation elements each having an input end separately connected to output ends of the n equalization elements, and wherein each mirroring cancellation element is configured to receive the n signals obtained through equalization compensation and that are output by each of the n equalization elements, perform mirroring cancellation processing on the n signals obtained through equalization compensation, and output n signals obtained through mirroring cancellation.

2. The apparatus according to claim 1, further comprising:
    a delay solver having an input end connected to an output end of the analog-to-digital conversion unit, and having an output end separately connected to input ends of the n digital predistortion elements, and wherein the delay solver is configured to receive the extracted signal output by the analog-to-digital conversion unit, perform solving based on the extracted signal to obtain a feedback signal, and send the feedback signal to the n digital predistortion elements.

3. The apparatus according to claim 2, wherein the n digital predistortion elements are configured to perform digital predistortion processing on the n input signals based on the feedback signal.

4. The apparatus according to claim 2, wherein the feedback signal is a low-speed integer delay signal.

5. The apparatus according to claim 1, further comprising:
    n crest factor reduction elements each having an output end separately connected to input ends of each digital predistortion element, and wherein each crest factor reduction element is configured to receive an original input signal, perform crest factor reduction processing on the original input signal to obtain a respective input signal of the n input signals, and send the respective input signal to each of the n digital predistortion elements.

6. The apparatus according to claim 1, wherein the analog-to-digital conversion unit comprises:
    an analog-to-digital converter (ADC) configured to receive the n processed signals, perform analog-to-digital conversion, and output a converted-to digital signal.

7. The apparatus according to claim 6, wherein the analog-to-digital conversion unit comprises:
    a deep undersampling element connected to the ADC and configured to perform signal extraction based on the converted-to digital signal, and output the extracted signal.

8. The apparatus according to claim 1, wherein each of the n digital predistortion elements is further configured to perform delay processing on the n input signals before performing digital predistortion processing on the n input signals.

* * * * *